United States Patent
Yoo et al.

(10) Patent No.: US 6,625,242 B1
(45) Date of Patent: Sep. 23, 2003

(54) DELAY LOCKED LOOPS AND METHODS THAT SHIFT THE PHASE OF A DELAYED CLOCK SIGNAL BASED ON A REFERENCE PHASE VALUE

(75) Inventors: Chang-sik Yoo, Kyungki-do (KR); Sang-bo Lee, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/466,395

(22) Filed: Dec. 17, 1999

(30) Foreign Application Priority Data

Jan. 27, 1999 (KR) .......................... 1999-2589

(51) Int. Cl.[7] .............. H03D 3/24; H04B 1/69; H03L 7/06
(52) U.S. Cl. ................ 375/376; 375/150; 327/158
(58) Field of Search ............... 375/376, 191–223; 365/191–223; 327/113–269

(56) References Cited

U.S. PATENT DOCUMENTS

| | | | |
|---|---|---|---|
| 3,573,636 A | * 4/1971 | Lammers | 327/2 |
| 4,095,186 A | * 6/1978 | Vesel | 327/241 |
| 5,463,337 A | * 10/1995 | Leonowich | 327/158 |
| 5,614,855 A | 3/1997 | Lee et al. | 327/158 |
| 5,629,651 A | * 5/1997 | Mizuno | 331/34 |
| 5,642,082 A | * 6/1997 | Jefferson | 331/17 |
| 5,699,020 A | * 12/1997 | Jefferson | 331/17 |
| 5,838,179 A | * 11/1998 | Schmidt | 327/156 |
| 5,875,219 A | 2/1999 | Kim | 375/376 |
| 5,917,850 A | * 6/1999 | Fujita et al. | 375/150 |
| 6,011,732 A | * 1/2000 | Harrison et al. | 365/194 |
| 6,084,449 A | * 7/2000 | Shimizume | 327/158 |
| 6,115,439 A | * 9/2000 | Andresen et al. | 375/376 |

FOREIGN PATENT DOCUMENTS

| | | | |
|---|---|---|---|
| WO | WO98/37656 A2 | 2/1998 | H04L/7/00 |
| WO | WO99/67882 A1 | 4/1999 | H03L/7/081 |

OTHER PUBLICATIONS

Search Report, GB 0001904.2, Apr. 18, 2000.

* cited by examiner

*Primary Examiner*—Stephen Chin
*Assistant Examiner*—Lawrence Williams
(74) *Attorney, Agent, or Firm*—Myers Bigel Sibley & Sajovec (57) ABSTRACT

A delay locked loop generates an advanced clock signal synchronized with a reference clock signal. The delay locked loop includes an input buffer, a variable delay circuit, a delay compensation circuit, a phase shifter, a delay controller, a phase sensing pump and a phase inversion controller. The variable delay circuit includes a multiplicity of delay terminals. The number of enabled delay terminals is controlled by a counting signal group. In the phase shifter, the phase of an output signal of the variable delay circuit generates the advanced clock signal with a phase of the reference clock signal. When the compared phase difference is more than Π, the phase shifter inverts a delayed clock signal to generate the advanced clock signal. When the compared phase difference is less than Π, the delayed clock signal is non-inverted to be generated as the advanced clock signal.

15 Claims, 8 Drawing Sheets

DELAY LOCKED LOOPS AND METHODS THAT SHIFT THE PHASE OF A DELAYED CLOCK SIGNAL BASED ON A REFERENCE PHASE VALUE

FIELD OF THE INVENTION

The present invention relates to electronic circuits and operating methods, and more particularly, to delay locked loops and delay locking methods using the same.

BACKGROUND OF THE INVENTION

A delay locked loop may be used to provide a clock signal having a predetermined phase shift with respect to a reference clock signal. Even though the clock signal supplied by the delay locked loop is shifted with respect to the reference clock, the phase is earlier than the reference clock. The signal generated by the delay locked loop will be referred to herein as an advanced clock signal.

Generally, an advanced clock signal may be used in an integrated circuit (IC) having relatively high integration, such as a Merged Memory with Logic (MML), a Rambus DRAM (RDRAM), and a Double Data Rate Synchronous DRAM (DDR). The reference clock signal is input at an input pin to be distributed throughout the entire device. The reference clock signal arriving at a position relatively far from the input pin may be more delayed with respect to the reference clock signal at a position adjacent to the input pin. Due to the delay difference, it may be difficult to maintain synchronization of each portion of the IC.

Thus, the delay locked loop may be included in the IC. The delay locked loop generally is located near an input pin that receives a reference clock signal. The delay locked loop receives the reference clock signal, and generates an advanced clock signal. The advanced clock signal is similar to the reference clock signal in frequency and length. However, the advanced clock signal is advanced against the reference clock signal by a phase corresponding to the delay time from the near position to the far position with reference to the input pin that receives the reference clock signal. The reference clock signal is used near the input pin of the reference clock signal, and the advanced reference clock signal is transferred to circuits far from the input pin. In this manner, a synchronized clock signal may be received in all parts of the IC, and the synchronized signal can allow the IC to operate in synchronism with the reference clock signal even at a very high speed.

Figure 1:
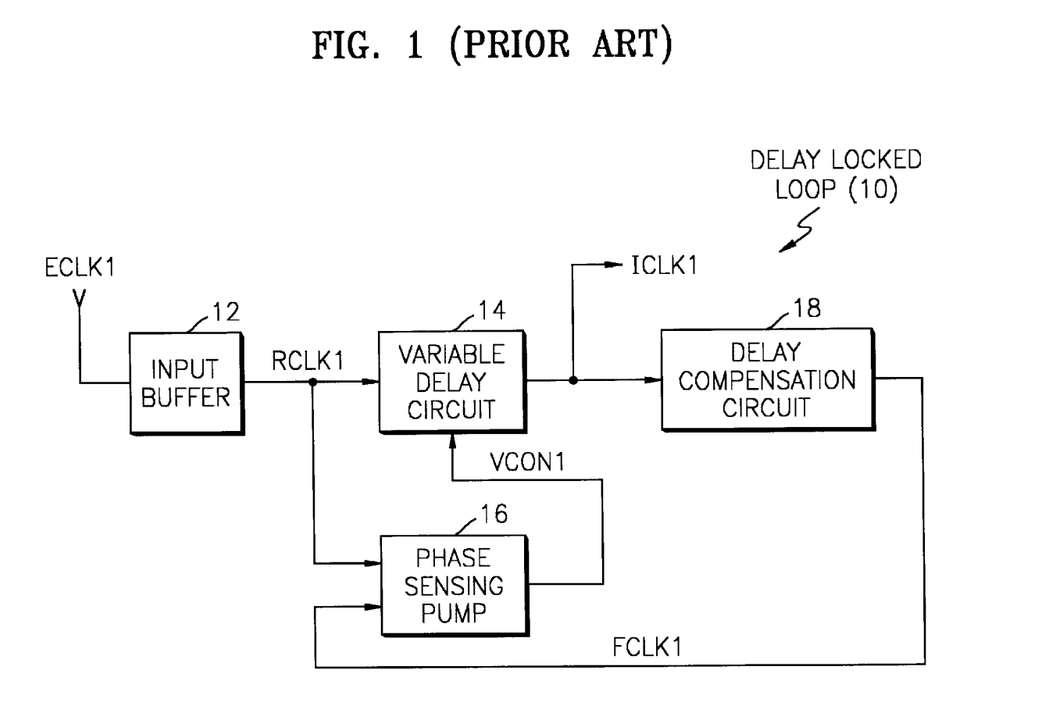
FIG. 1 is a block diagram of a conventional delay locked loop.

FIG. 1 is a schematic block diagram of a conventional delay locked loop. The conventional delay locked loop 10 includes an input buffer 12, a variable delay circuit 14, a phase sensing pump 16 and a delay compensation circuit 18. The input buffer 12 buffers an external clock signal ECLK1 to supply a reference clock signal RCLK1.

The delay locked loop controls the delay time according to the variable delay circuit 14 so that the phase of the feedback clock signal FCLK1 coincides with the phase of the reference clock signal RCLK1. Other delay locked loops are described in U.S. Pat. Nos. 5,614,855; 5,642,082 and 5,875,219.

The variable delay circuit of the conventional delay locked loop includes n delay terminals, where n indicates a predetermined number. A variable delay range is defined by the predetermined number of delay terminals, which may restrict the operational frequency. That is, when a frequency lower than the operational frequency region is input, the phase shift of the variable delay circuit may not be increased, so that the jitter may be generated in the direction of the feedback signal earlier than the external pin signal. Also, when a frequency higher than the operational frequency region is input, the phase shift of the variable delay circuit may not be reduced, so that the jitter may be generated in the direction of the feedback signal later than the external input signal. Thus, the operational frequency of the IC may be defined by the delay locked loop.

SUMMARY OF THE INVENTION

It is an object of the present invention to provide delay locked loops and methods that can have an increased operational frequency region.

It is another object of the present invention to provide delay locked loops and methods that can match the phase of the feedback clock signal with that of the reference clock signal using the delay locked loop.

These and other objects may be provided, according to the present invention, by delay locked loops that generate an advanced clock signal that is synchronized with a received reference clock signal. The delay locked loops may comprise a phase sensing pump that senses a phase difference between feedback signals related to the advanced clock signal with respect to the reference clock signal, to supply a control signal controlling a voltage level in accordance with the direction of the phase difference. A variable delay circuit delays the reference clock signal, corresponding to the voltage level of the control signal supplied from the phase sensing pump. A phase shifter compares the phase of the reference clock signal with the phase of a delayed clock signal delayed by the variable delay circuit, to generate the advanced clock signal. The advanced clock signal is generated by shifting the delayed clock signal by the reference phase value, when a phase difference of the delayed clock signal with respect to the reference clock signal is more than a reference phase value, and is generated without shifting the phase, when a phase difference of the delayed clock signal with respect to the reference clock signal is less than the reference phase value.

According to another aspect of the present invention, delay locked loops that generate an advanced clock signal synchronized with a reference clock signal, may comprise a phase sensing pump that senses a phase difference between feedback signals related to the phase of the advanced clock signal with respect to the phase of the reference clock signal, and supplies a control signal controlling a voltage level in accordance with the direction of the phase difference. A variable delay circuit includes multiple delay terminals that delay the reference clock signal to generate the advanced clock signal, in response to the voltage level of the control signal supplied from the phase sensing pump. The number of delay terminals included in the variable delay circuit is controlled by the quantity of the phase difference of the feedback clock signal with respect to the reference signal.

According to still another aspect of the present invention, delay locked loops that generate an advanced clock signal synchronized with a reference clock signal, may comprise a phase sensing pump that senses a phase difference between feedback signals related to the phase of the advanced clock signal with respect to the reference clock signal, and supplies a control signal that controls a voltage level in accordance with the direction of the phase difference. A variable delay circuit including multiple delay terminals, delays the reference clock signal, corresponding to the voltage level of the control signal supplied from the phase sensing pump, to generate the advanced clock signal. The number of the activated delay terminals of the variable delay circuit preferably is controlled by a frequency of the reference clock signal.

Delay lock methods according to the invention can use a delay locked loop that generates an advanced clock signal synchronized with a reference clock signal. Delay lock methods using a delay locked loop to generate an advanced clock signal synchronized with a reference clock signal, may comprise the steps of a) delaying the reference clock signal to generate a delayed clock signal; b) sensing a phase difference of the delayed clock signal with respect to the reference clock signal; c) determining whether the phase difference is more than a predetermined reference phase value; d) shifting the phase of the delayed clock signal when the phase difference is more than the reference phase value to generate the advanced clock signal; and e) controlling the amount of delay in the reference clock signal in step a).

According to another method aspect, delay lock methods for a variable delay circuit generating an advanced clock signal synchronized with a received reference clock signal, and the reference clock signal as multiple delay terminals, may comprise: a) sensing a phase difference between feedback signals related to a phase of the advanced clock signal with respect to the reference clock signal; b) inverting the phase of the feedback signal when the phase difference is more than Π; c) controlling the number of an activated delay terminals of the variable delay circuit, in response to a width of the phase difference; and d) delaying the reference clock signal by the delay time varied in response to the direction of the phase difference, to generate the advanced clock signal.

According to delay locked loops and delay lock methods of the present invention, the operational frequency region can be increased. Also, excessive time need not be used for synchronizing the advanced clock signal ICLK2 with the reference clock signal RCLK2.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
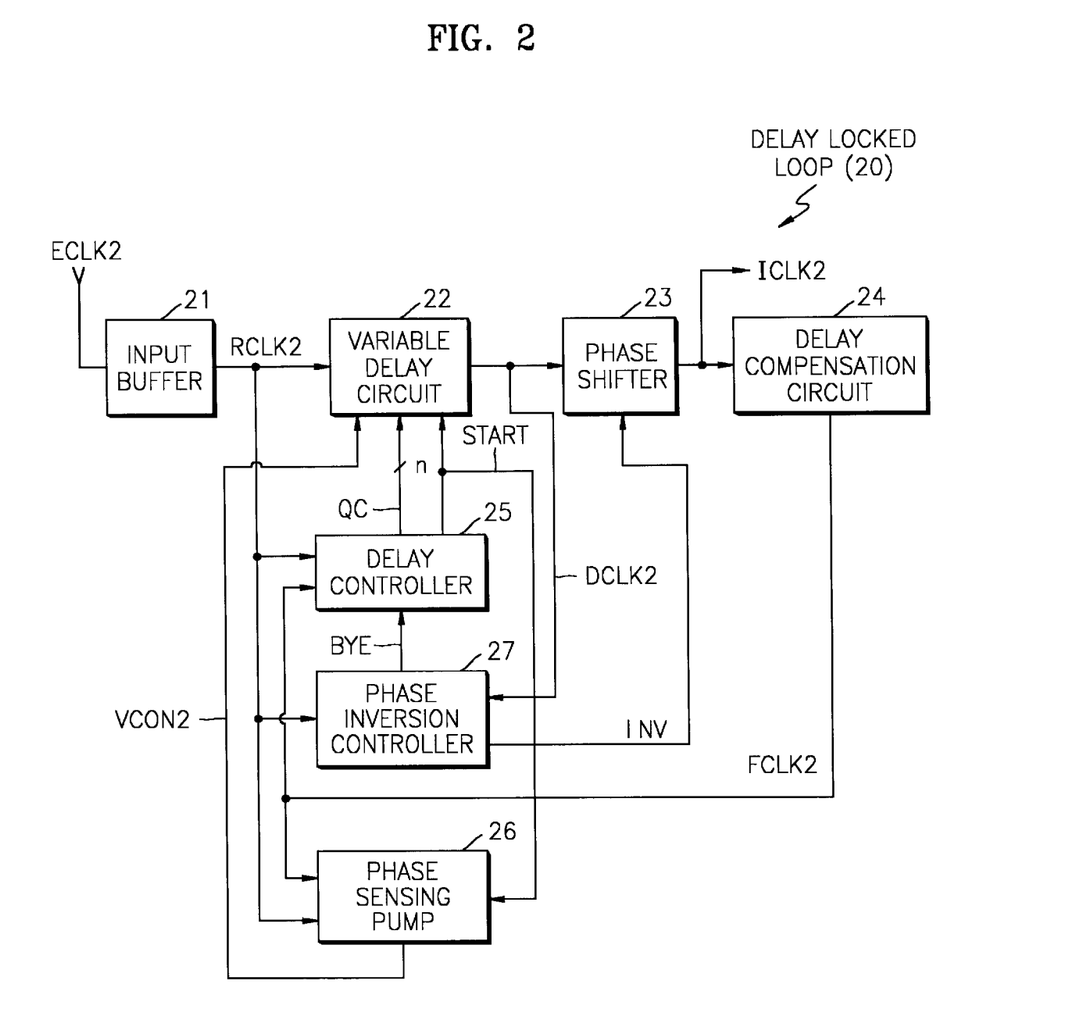
FIG. 2 is a block diagram of a delay locked loop according to an embodiment of the present invention.

Referring to FIG. 2, a delay locked loop 20 includes an input buffer 21, a variable delay circuit 22, a phase shifter 23, a delay compensation circuit 24, a delay controller 25, a phase inversion controller 27 and a phase sensing pump 26.

The input buffer 21 buffers an external clock signal ECLK2 to supply a reference clock signal RCLK2.

The variable delay circuit 22 receives the reference clock signal RCLK2 to generate a delayed clock signal DCLK2 generating an advanced clock signal ICLK2. The variable delay circuit 22 includes multiple delay terminals. The delayed clock signal DCLK2 is a signal obtained by delaying the reference clock signal RCLK2 by the delay terminal. Preferably, the number of delay terminals enabled in the variable delay circuit 22 is controlled by the group of counting signals QC output from the delay controller 25.

The phase shifter 23 receives the delayed clock signal DCLK2, and provides the advanced clock signal ICLK2. The relationship in phase between the advanced clock signal ICLK2 and the delayed clock signal DCLK2 is determined by a phase difference of the delayed clock signal DCLK2 with respect to the reference clock signal RCLK2. That is, when the phase difference of the delayed clock signal DCLK2 with respect to the reference clock signal RCLK2 is more than a predetermined reference phase value, the phase of the delayed clock signal DCLK2 is shifted by the reference phase value to generate the advanced clock signal ICLK2. When the phase difference of the delayed clock signal DCLK2 with respect to the reference clock signal RCLK2 is less than the reference phase value, the advanced clock signal ICLK2 is generated with the same phase as the delayed clock signal DCLK2.

Preferably, the reference phase value is Π, so that when a phase difference of the delayed clock signal DCLK2 with respect to the reference clock signal RCLK2 is Π or more, the advanced clock signal ICLK2 is an inverted signal of the delayed clock signal DCLK2. When a phase difference of the delayed clock signal DCLK2 with respect to the reference clock signal RCLK2 is Π or less, the advanced clock signal ICLK2 is a non-inverted signal of the delayed clock signal DCLK2.

The delay compensation circuit 24 is a circuit that compensates for the phase shifter 23, i.e., a transfer delay time from an output point of the delay locked loop 20 to a point where the advanced clock signal ICLK2 is used. If a delay time is generated while the reference clock signal RCLK2 reaches the phase sensing pump 26, the delay compensation circuit 24 compensates for the delay time.

If the delay compensation circuit 24 is not included in the delay locked loop 20, a skew may be generated between a point near the output point of the delay locked loop 20 and a point far from the output point thereof due to the transfer delay time. However, even if the delay compensation circuit 24 is not included in the delay locked loop, an effect according to the present invention can be achieved. Also, an output signal of the delay compensation circuit 24 may be a feedback signal FCLK2 provided to the phase sensing pump 26.

The phase sensing pump 26 senses a difference in phase between the reference clock signal RCLK2 and the feedback signal FCLK2. Also, the phase sensing pump 26 generates an analog control signal VCON2.

The voltage level of the analog control signal VCON2 is controlled by the direction of the phase difference of the feedback signal FCLK2 with respect to the reference clock signal RCLK2. That is, when the phase of the feedback signal FCLK2 is earlier than that of the reference clock signal RCLK2, the voltage level of the analog control signal VCON2 changes in the direction of increasing the delay time according to the variable delay circuit 22. Also, when the phase of the feedback signal FCLK2 is later than the phase of the reference clock signal RCLK2, the voltage level of the analog control signal VCON changes in the direction of reducing the delay time according to the variable delay circuit 22.

Preferably, the phase sensing pump 26 is enabled by the signal START after the number of delay terminals enabled by the variable delay circuit 22 is determined.

The phase inversion controller 27 senses a difference in phase between the reference clock signal RCLK2 and the delayed clock signal DCLK2, to supply a phase shift control signal INV and a delay controller enable signal BYE.

The phase shift control signal INV controls the phase shifter 23. When the phase difference of the delayed clock signal DCLK2 with respect to the reference clock signal RCLK2 is more than the reference phase value, the phase shift control signal INV is activated. Also, when the phase difference of the delayed clock signal DCLK2 with respect to the reference clock signal RCLK2 is less than the reference phase value, the phase shift control signal INV is deactivated. Preferably, the reference phase is Π.

When the phase shift control signal INV is activated, the phase shifter 23 inverts the delayed clock signal DCLK2 to generate the advanced clock signal ICLK2.

The delay controller enable signal BYE is activated to enable the delay controller 25 after it is determined whether the delayed clock signal DCLK2 is inverted or not, i.e., whether the phase shift control signal is activated or not.

The delay controller 25 senses a difference in phase between the reference clock signal RCLK2 and the feedback signal FCLK2, to supply an analog start signal START and the counting signal group QC.

The counting signal group QC includes n1 signals, i.e., QC[i], where i is 1 to n. Also, the counting signals QC[i] are activated, where i is increased corresponding to a difference in phase between the reference clock signal RCLK2 and the feedback signal FCLK2.

The number of the delay terminals enabled in the variable delay circuit 22 is controlled by the counting signal group QC. Thus, the number of the delay terminals enabled in the variable delay circuit 22 is determined by the width of the phase difference between the reference clock signal RCLK2 and the feedback signal FCLK2.

The analog start signal START is activated to activate the phase sensing pump 26 after the number of the delay terminals enabled in the variable delay circuit 22 is determined.

Figure 3:
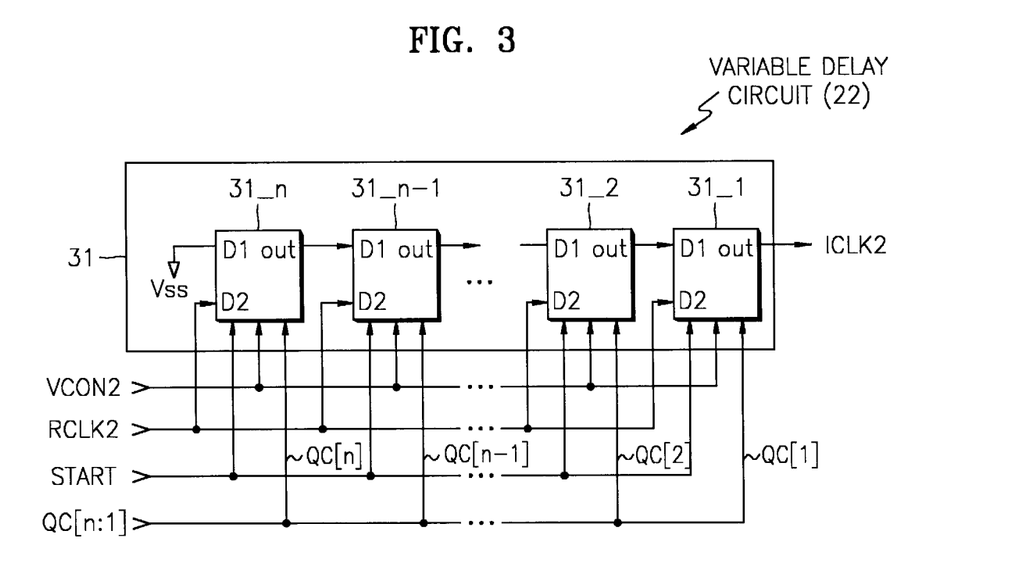
FIG. 3 is a schematic block diagram of a variable delay circuit of FIG. 2.

FIG. 3 is a schematic block diagram of a variable delay circuit 22 of FIG. 2. Referring to FIG. 3, the variable delay circuit 22 includes n delay terminals 31_i, where i is 1 to n. Also, the number of delay terminals is controlled by the counting signal group QC[n:1].

Each of the delay terminals 31_i, receives data through a first input terminal D1 and a second input terminal D2, and outputs data through an output terminal out. The delay terminals 31_i delay a signal input through the second input terminal D2 by a predetermined delay value Td to output the delayed value, when the counting signal QC[i] corresponding to the delay terminals is activated. When the corresponding counting signal QC[i] is deactivated, the signal input through the first input terminal D1 is delayed by the delay value Td to output the delayed value. Also, one signal of the counting signal group QC[n:1] is activated.

Ground voltage Vss is applied to the first input terminal D1 of first delay terminal 31_n, and an output signal of a previous delay terminal is applied to the first input terminal D1 of a next delay terminal 31_i, where i=n−1 to 1. The reference clock signal RCLK2 is applied to the second input terminal D2 of the delay terminals 31_i, where i is 1 to n.

Thus, when the counting signal QC[n] enabling the first delay terminal 31_n is activated, the reference clock signal RCLK2 is input through the second input terminal D2 of the delay terminal 31_n to output a signal delayed by n delay terminals. Therefore, the output signal ICLK2 of the last delay terminal 31_1 is delayed by n*Td from the reference clock signal RCLK2.

When the counting signal QC[1] enabling the last delay terminal 31_1 is activated, the reference clock signal RCLK2 is input through the second input terminal D2 of the delay terminal 31_1 to output a signal delayed by one delay terminal. Therefore, the output signal ICLK2 of the last delay terminal 31_1 is delayed by Td with respect to the reference clock signal RCLK2.

According to the present invention, the variable delay circuit includes n delay terminals controlled by the counting signal QC, and the output signal of the last delay terminal 31_1 of the variable delay circuit 22 is the advanced clock signal ICLK2. However, the variable delay circuit 22 may additionally include a delay terminal enabled regardless of activation of the counting signal QC, and delay terminals delaying the reference clock signal for a period of time different to the delay value Td.

After the number of delay terminals of the variable delay circuit 22 is determined, the analog start signal START is activated to high. Therefore, the number of delay terminals of the variable delay circuit 22 is not changed, and the phase sensing pump 26 is enabled.

Figure 4:
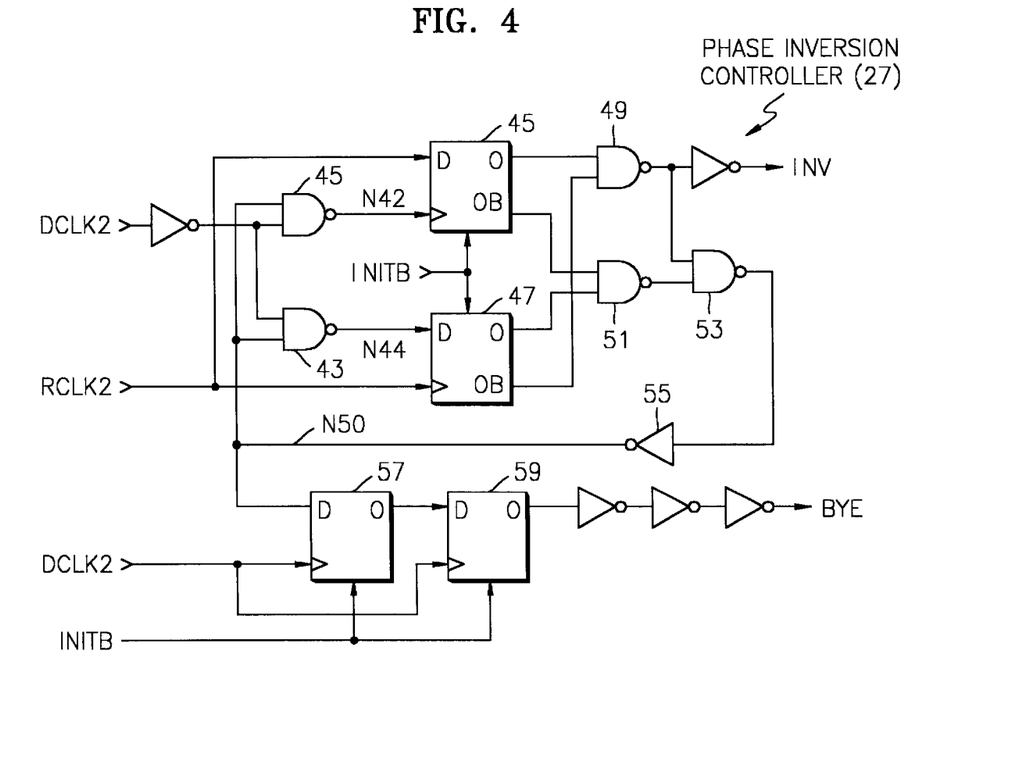
FIG. 4 is a circuit diagram of a phase inversion controller of FIG. 2.
Figure 5A:
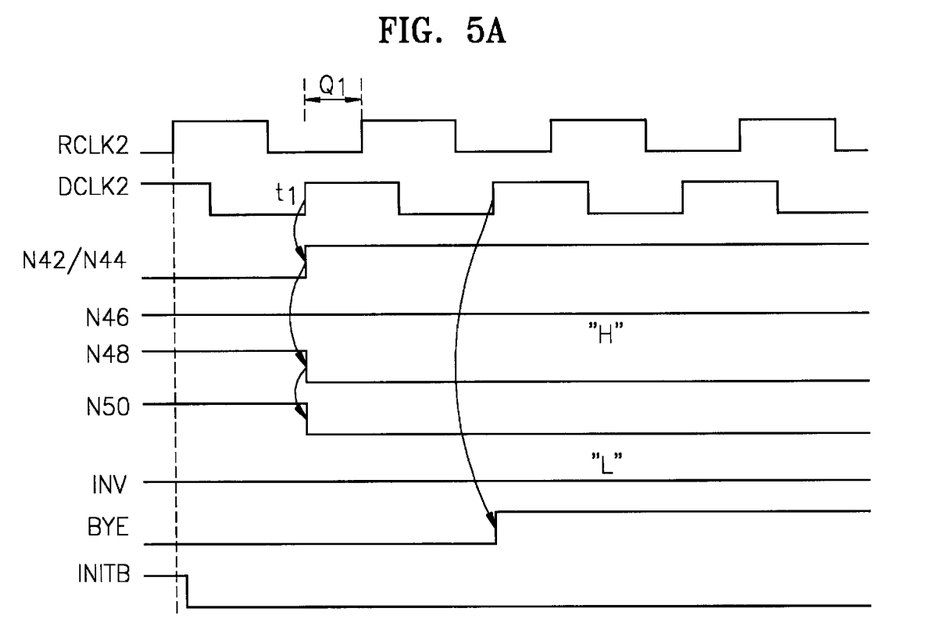
FIG. 5A is a timing diagram of the main terminals of FIG. 4 when the phase difference of a delayed clock signal DCLK2 with respect to a reference clock signal RCLK2 is Π or less.
Figure 5B:
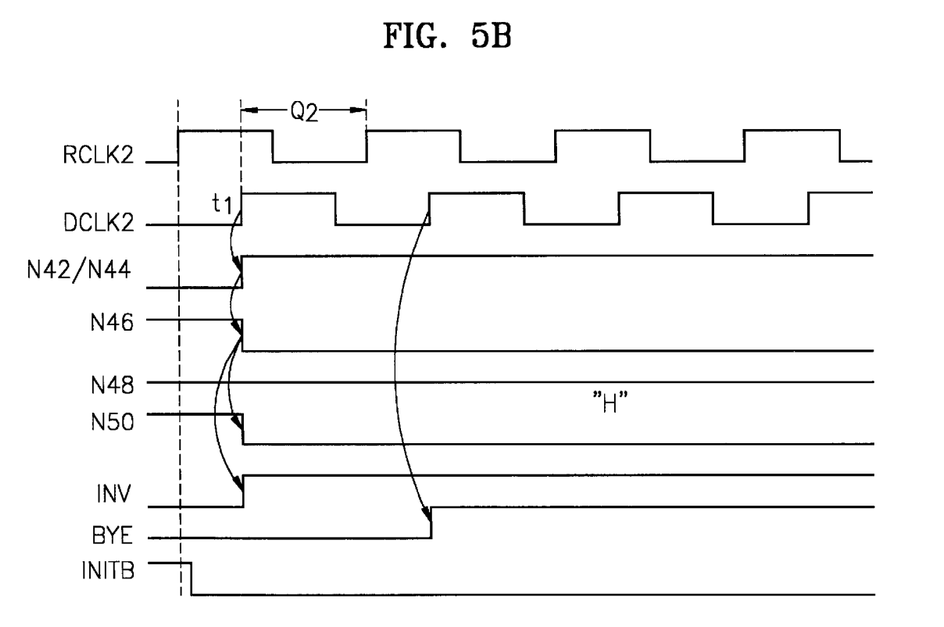
FIG. 5B is a timing diagram of the main terminals of FIG. 4 when the phase difference of a delayed clock signal DCLK2 with respect to a reference clock signal RCLK2 is Π or more.

FIG. 4 is a circuit diagram of a phase inversion controller 27 of FIG. 2. FIG. 5A is a timing diagram of the main terminals of FIG. 4 when the phase difference of the delayed clock signal DCLK2 with respect to the reference clock signal RCLK2 is Π or less, and FIG. 5B is a timing diagram of the main terminals of FIG. 4 when the phase difference of the delayed clock signal DCLK2 with respect to the reference clock signal RCLK2 is Π or more.

Flipflops 45, 47, 57 and 59 of FIG. 4 are enabled by activation of an initial signal INITB. The initialization signal INITB is activated, when a stable external power supply is supplied, or an initial operation mode program is completed in the case of a synchronous DRAM, i.e., SDRAM.

Operation of the phase inversion controller 27 when a phase difference θ1 of the delayed clock signal DCLK2 with respect to the reference clock signal RCLK2 is Π or less will be described with reference to FIGS. 4 and 5A.

The initial state of the output signals N46 and N48 of NAND gates 49 and 51 is high. The initial state of the phase shift control signal INV is low, and the initial state of an output signal N50 of an inverter 55 is high.

When the delayed clock signal DCLK2 generating a clock input signal of the flip-flops 45 and 47 is activated to a logic high value, the logic state of the reference clock signal RCLK2 is high, as shown by t1 of FIG. 5A. Then, while an output signal N46 of the NAND gate 49 is held high, the output signal N48 of the NAND gate 51 becomes low. Therefore, the logic state of the phase shift control signal INV is low as before. The output signal N50 of the inverter 55 goes to low. The initialization signal INITB is activated to low, and then the delay controller enable signal BYE is activated to high in response to the second rising edge of the delayed clock signal DCLK2 which is second-activated.

The operation of the phase inversion controller 27 will now be described with reference to FIGS. 4 and 5B for when a phase difference θ1 of the delayed clock signal DCLK2 with respect to the reference clock signal RCLK2 is Π or more.

Similar to the case in FIG. 5A, the initial state of the output signals N46 and N48 of the NAND gates 49 and 51 is high. The initial state of the phase shift control signal INV is low, and the initial state of an output signal N50 of an inverter 55 is high.

When the delayed clock signal DCLK2 generating a clock input signal of the flipflops 45 and 47 is activated to a logic high value, the logic state of the reference clock signal RCLK2 is high, as shown by t1 of FIG. 5B. Thus, an output signal N46 of the NAND gate 49 becomes low. The output signal N48 of the NAND gate 51 is held at high. Therefore, the phase shift control signal INV is activated to a logic high value. The initialization signal INITB is activated to low, and then the delay controller enable signal BYE is activated to high in response to the second rising edge of the delayed clock signal DCLK2 which is second-activated.

As described above, the delay controller enable signal BYE is activated at a point where the two clocks are both a logic high value after activation of the phase shift control signal INV is determined, and enables the delay controller 25 (see FIG. 2).

The phase shift control signal INV is activated when the phase difference of the delayed clock signal DCLK2 with respect to the reference clock signal RCLK2 is Π or more, and the activation state is maintained while the phase difference is within Π.

Figure 6:
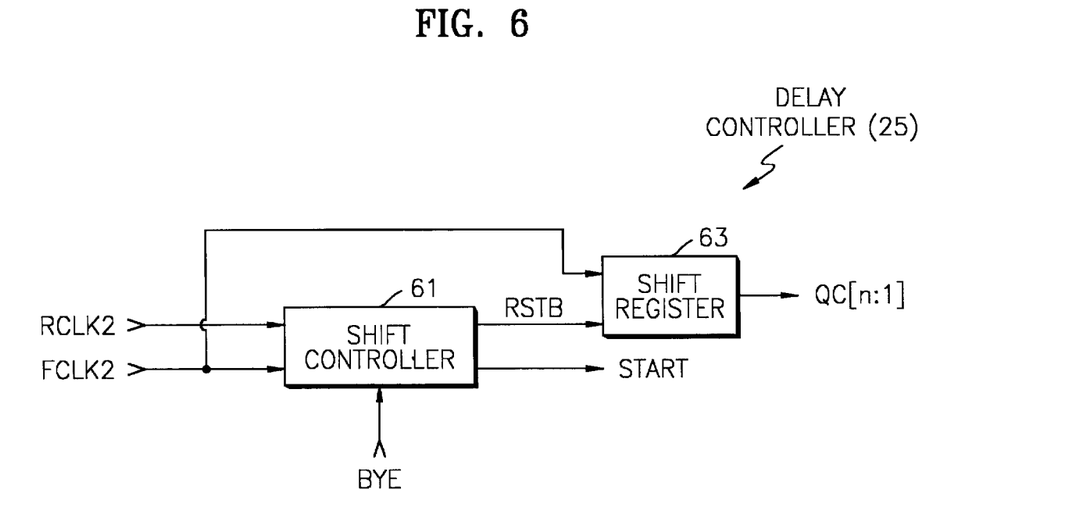
FIG. 6 is a block diagram showing a delay controller of FIG. 2.

FIG. 6 is a block diagram of a delay controller 25 of FIG. 2. Referring to FIG. 2, the delay controller 25 includes a shift controller 61 and a shift register 63.

The shift controller 61 is enabled by activation of the delay controller enable signal BYE. The shift controller 61 senses the difference in phases between the reference clock signal RCLK2 and the feedback clock signal FCLK2, to generate a register control signal RSTB and the analog start signal START.

The analog start signal START is a signal enabling the phase sensing pump 26, after the number of delay terminals enabled in the variable delay circuit 22 is determined. That is, the analog start signal START becomes high, when the number of the delay terminals of the variable delay circuit 22 (see FIG. 2) is controlled.

The register control signal RSTB transits a logic state, where the phase thereof corresponds to the feedback signal FCLK2 lagged with respect to the reference clock signal RCLK2. The register control signal RSTB controls the shift register 63.

The shift register 63 is enabled by the register control signal RSTB. Also, the shift register 63 receives the feedback signal FCLK2 to generate a counting signal group QC[n:1] having n signals. The counting signal group QC[n:1] is a signal activating one of n signals. Also, the counting signal group QC[n:1] activates a signal increasing the number of delay terminals of the delay unit 31 of the variable delay circuit 22 (see FIG. 2), whenever the feedback signal FCLK2 is activated, in an interval during which the register control signal RSTB is high.

Figure 7:
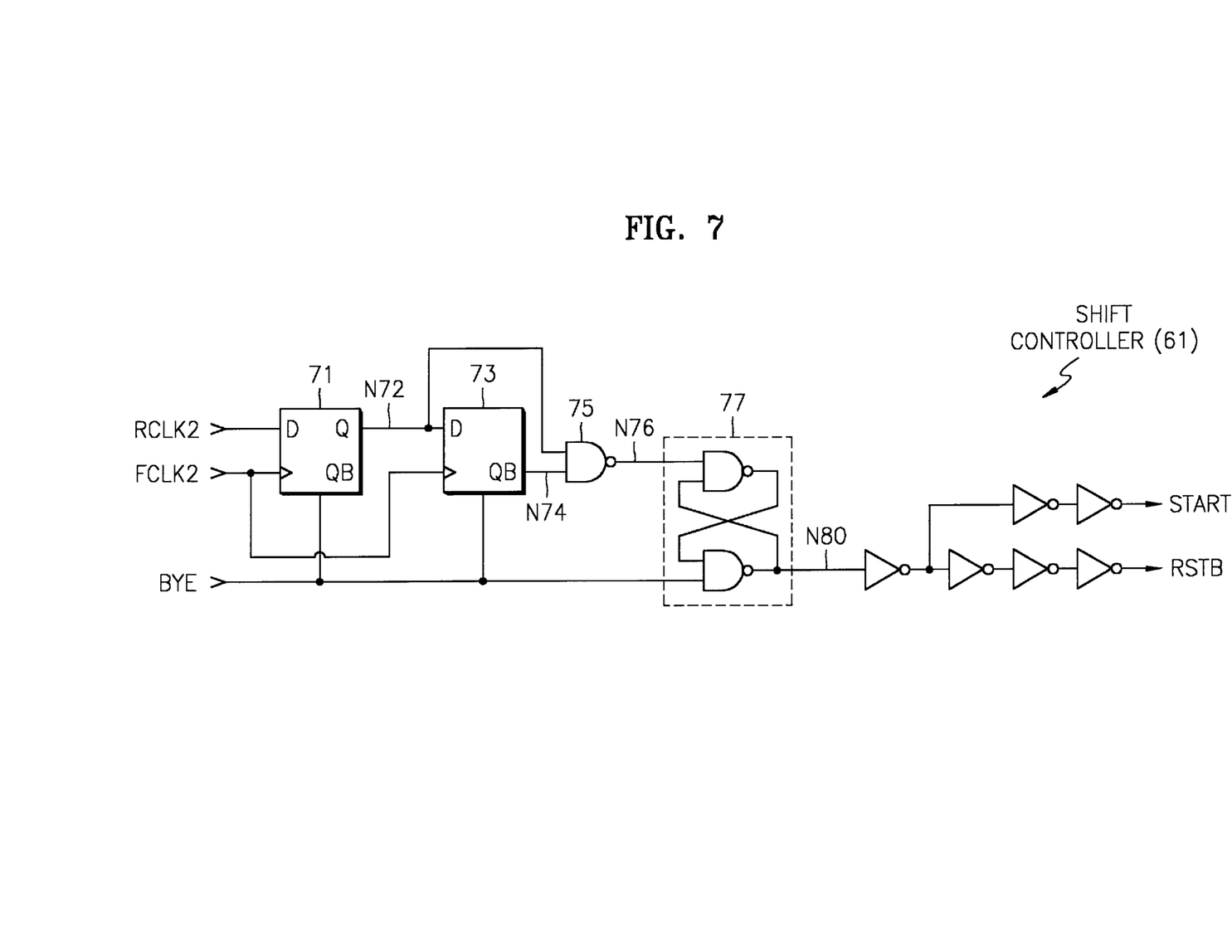
FIG. 7 is a circuit diagram of a shift controller of FIG. 6.
Figure 8:
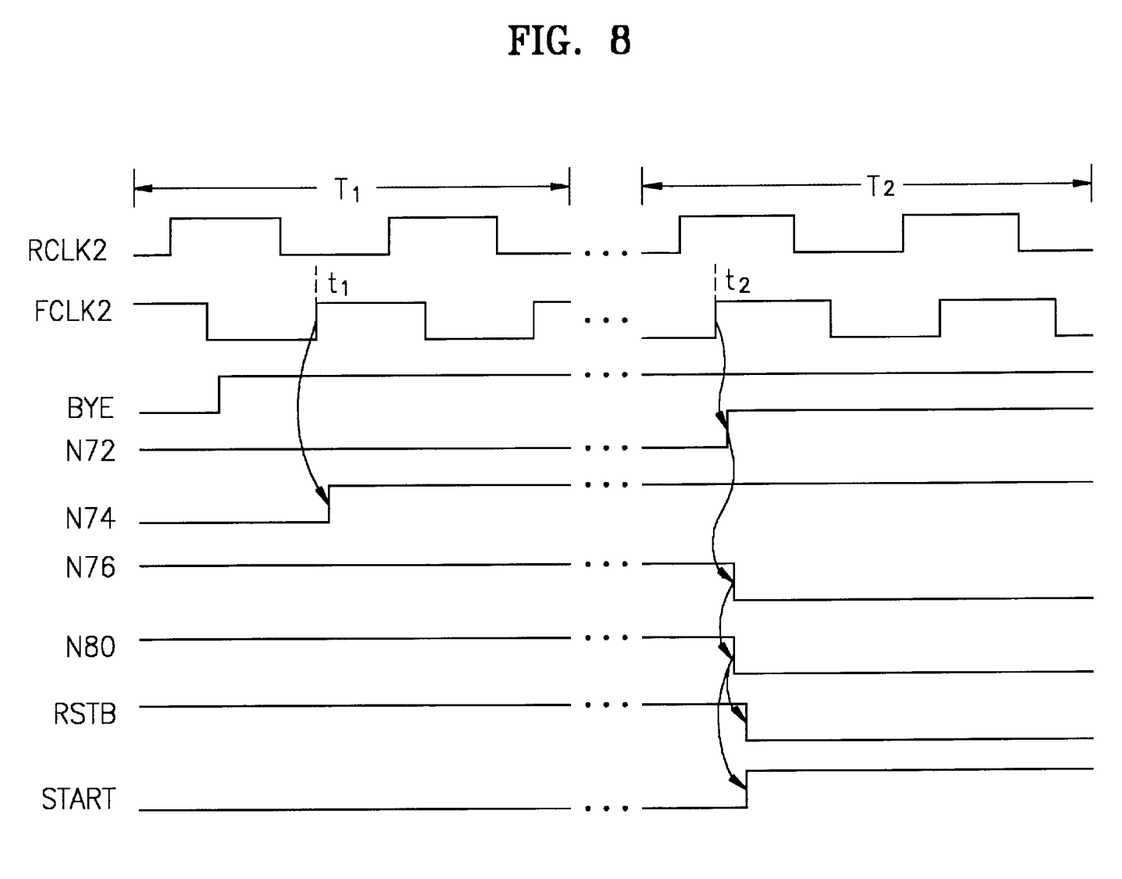
FIG. 8 is a timing diagram of the main terminals corresponding to FIG. 7.

FIG. 7 is a circuit diagram of the shift controller 61 of FIG. 6. FIG. 8 is a timing diagram of the main signals related to FIG. 7. In interval T1 of FIG. 8, the phase of the feedback signal FCLK2 leads that of the reference clock signal RCLK2. Also, in interval T2 of FIG. 8, the phase of the feedback signal FCLK2 lags that of the reference clock signal RCLK2.

The shift controller 61 will be described with reference to FIGS. 7 and 8.

The shift controller 61 includes two flipflops 71 and 73 and a latch 77. The flipflops 71 and 73 and the latch 77 are enabled by activation of the delay controller enable signal BYE.

The initial state of an output signal N80 of the latch 77 is high, and the initial state of the analog start signal START is low. The initial state of the register control signal RSTB is high.

Operation of the shift controller 61 in interval T1 of FIG. 8 in which the phase of the feedback clock signal FCLK2 leads to that of the reference clock signal RCLK2, will be described as follows.

In interval T1, when the feedback signal FCLK2 which is a clock input signal to the flipflop 71, is activated, the reference clock signal RCLK2 which is a data input signal to the flipflop 71 is low. Therefore, an output signal N72 of the flipflop 71 is held at a logic low value. An output signal N74 of the flipflop 73 becomes high at a point at which the feedback signal FCLK2 is activated.

However, an output signal N76 from the NAND gate 75 is held at a logic high. Thus, an output signal N80 from the latch 77 is held at a logic high value. Also, the analog start signal START and the register control signal RSTB are held at logic low and high values, respectively, which are the initial state.

Thus, in interval T1, the phase sensing pump 26 (see FIG. 2) is not enabled, and the shift register 63 (see FIG. 6) is enabled, to control the number of delay terminals of the variable delay circuit 22 (see FIG. 2).

Subsequently, operation of the shift controller 61 in interval T2 of FIG. 8 in which the phase of the feedback signal FCLK2 is lagged to that of the reference clock signal RCLK2, will be described as follows.

At point t2 of activating the feedback signal FCLK2 which is a clock input signal to the flipflop 71, the logic state of the reference clock signal RCLK2 which is a data input signal to the flipflop 71 is high. The output signal N72 from the flipflop 71 goes to logic high.

Thus, an output signal N76 of the NAND gate 75 goes to logic low, and an output signal N80 of the latch 77 goes to low. The analog start signal START goes to high, so that the phase sensing pump 26 (see FIG. 2) is enabled. The register control signal RSTB goes to low, so that the shift register 63 (see FIG. 6) is enabled.

Figure 9:
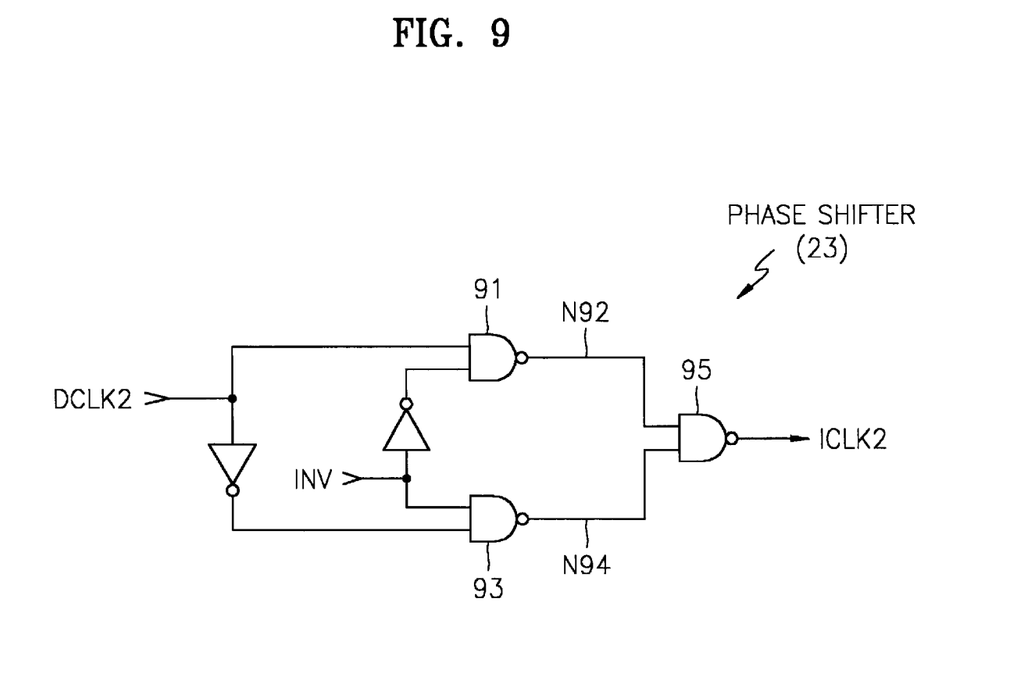
FIG. 9 is a circuit diagram of a phase shifter of FIG. 2.

FIG. 9 is a circuit diagram of the phase shifter 23 of FIG. 2. Referring to FIG. 2, the phase shifter 23 includes first through third logic gates 91, 93 and 95.

The first logic gate 91 inverts the delayed clock signal DCLK2 and outputs the inverted signal, when the phase shift control signal INV is deactivated.

The second logic gate 93 inverts the inverted signal of the delayed clock signal DCLK2 and outputs the inverted signal, when the phase shift control signal is activated.

The third logic gate 95 NAND-operates an output signal N93 of the first logic gate 91 and an output signal N94 of the second logic gate 93 and outputs an output signal thereof.

According to a preferred embodiment, the output signal of the third logic gate 95 is connected to the advanced clock signal ICLK2.

The advanced clock signal has the same phase as the delayed clock signal DCLK2, when the phase shift control signal INV is deactivated. The advanced clock signal ICLK2 has the same phase as the inversion signal of the delayed clock signal DCLK2.

Referring to FIG. 2, an operation sequence of the delay locked loop 20 is as follows.

The phase difference of the delayed clock signal DCLK2 with respect to the reference clock signal RCLK2 is sensed, to thereby determine whether to invert the delayed clock signal DCLK2.

When the inversion of the delayed clock signal DCLK2 is determined, the number of delay terminals in the variable delay circuit 22 is determined.

After the number of delay terminals in the variable delay circuit 22 is determined, the delay time according to the variable delay circuit is analog-controlled by the analog control signal VCON2 output from the phase sensing pump 26.

In the specification, an embodiment for a delay phase locked loop has been described. However, the present invention can be used for all lock loops generating an advanced clock signal synchronizing with a reference clock signal.

Also, the advanced clock signal ICLK2 output from the phase shifter 23 which is transferred to the delay controller 25 and the phase sensing pump 26 via the delay compensation circuit 24 in the specification, may be directly transferred to the delay controller 25 and the phase sensing pump 26.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A delay locked loop that generates an advanced clock signal that is synchronized with a reference clock signal, comprising:

a phase sensing pump that senses a phase difference between a signal related to the advanced clock signal and the reference clock signal, to supply a control signal that controls a voltage level in accordance with the direction of the phase difference;

a variable delay circuit that delays the reference clock signal, based on the voltage level of the control signal supplied from the phase sensing pump;

a phase inversion controller that compares the phase of the reference clock signal with the phase of a delayed clock signal delayed by the variable delay circuit, to generate a phase shift control signal; and a phase shifter that generates the advanced clock signal by shifting the phase of the delayed clock signal by the reference phase value when a phase difference of the delayed clock signal with respect to the reference clock signal is more than a reference phase value, and without shifting the phase of the delayed clock signal when a phase difference of the delayed clock signal with respect to the reference clock signal is less than the reference phase value.

2. A delay locked loop of claim 1, wherein the reference phase value is Π.

3. A delay locked loop of claim 1, wherein the phase shift control signal is activated when the phase difference of the delayed clock signal with respect to the reference clock signal is more than the reference phase value.

4. A delay locked loop of claim 1, wherein the phase shifter comprises:

a first logic gate enabled by deactivation of the phase shift control signal, that receives the delayed clock signal to output a first output clock signal;

a second logic gate enabled by activation of the phase shift control signal, that receives the delayed clock signal to output a second output clock signal; and a third logic gate receiving the first output clock signal of the first logic gate and the second output clock signal of the second logic gate to generate the advanced clock signal that has the same phase as the delayed clock signal when the phase shift control signal is deactivated, and the same phase as the inverted delayed clock signal when the phase shift control signal is activated.

5. A delay locked loop of claim 1, further comprising a delay controller that compares the difference between the phase of the reference clock signal and that of the signal related to the advanced clock signal, to thereby supply an output signal to control the quantity of the delay in the reference clock signal, the delay controller enabled in response to a delay controller enable signal generated by the phase inversion controller.

6. A delay locked loop that generates an advanced clock signal that is synchronized with a reference clock signal, comprising:

a phase sensing pump that senses a phase difference between a signal related to the advanced clock signal and the reference clock signal, and that supplies a control signal that controls a voltage level in accordance with the direction of the phase difference;

a delay controller that senses a phase difference between a signal related to the advanced clock signal and the reference clock signal, to thereby supply a counting signal group that controls the number of delay terminals included to the variable delay circuit; and a variable delay circuit including multiple delay terminals that delay the reference clock signal to generate a delayed clock signal, in response to the voltage level of the control signal supplied from the phase sensing pump, the number of delay terminals included to the variable delay circuit also being controlled by the quantity of the phase difference of the signal related to the advanced clock signal with respect to the reference clock signal.

7. A delay locked loop of claim 6, further comprising a phase inversion controller that compares the phase of the delay clock signal with that of the reference clock signal, to thereby generate a phase shift control signal and a phase shifter that shifts the phase of the delayed clock signal in response to the phase shift control signal, to thereby generate the advanced clock signal.

8. A delay locked loop that generates an advanced clock signal that is synchronized with a reference clock signal, comprising:

a phase sensing pump that senses a phase difference between a signal related to the advanced clock signal and the reference clock signal, and that supplies a control signal that controls a voltage level in accordance with the direction of the phase difference;

a variable delay circuit including multiple delay terminals that delays the reference clock signal, corresponding to the voltage level of the control signal supplied from the phase sensing pump, to generate a delayed clock signal;

a delay controller that senses the phase difference between the signal related to the advanced clock signal and the reference clock signal, to thereby supply a counting signal group that controls the number of delay terminals included to the variable delay circuit, the number of the activated delay terminals of the variable delay circuit also being controlled by the frequency of the reference clock signal; and a phase shifter that receives the delayed clock signal and generates the advanced clock signal by shifting the phase of the delayed clock signal by a reference phase value.

9. A delay lock method using a delay locked loop to generate an advanced clock signal synchronized with a reference clock signal, comprising the steps of:

a) delaying the reference clock signal to generate a delayed clock signal;

b) determining whether the phase difference between the delayed clock signal and the reference clock signal is more than a predetermined reference phase value;

c) shifting the phase of the delayed clock signal when the phase difference is more than the reference phase value, to generate the advanced clock signal; and d) controlling the amount of delay in the reference clock signal in step a).

10. A delay lock method of claim 9, wherein the reference phase value is Π.

11. A delay lock method for a variable delay circuit that generates an advanced clock signal that is synchronized with a received reference clock signal, the delay lock method comprising the steps of:

a) sensing a phase difference between feedback signals related to a phase of the advanced clock signal with respect to the reference clock signal;

b) inverting the phase of the feedback signal when the phase difference is more than $\pi$;

c) controlling the number of activated delay terminals of the variable delay circuit, in response to a width of the phase difference; and d) delaying the reference clock signal by the delay time that is varied in response to the direction of the phase difference, to thereby generate the advanced clock signal.

12. A delay locked loop of claim 8, further comprising a phase inversion controller that compares the phase of the reference clock signal with the phase of the delayed clock signal, to generate the phase shift control signal to the phase shifter.

13. A delay locked loop of claim 12, wherein the phase inversion controller generates a delay control enable signal to enable the delay controller.

14. A delay locked loop of claim 5, wherein the delay controller comprises a shift controller receiving the reference clock signal and the signal related to the advanced clock signal to generate a start signal and a reset signal, and a shift register receiving the reset signal to generate the output signal to control the quantity of the delay of the reference clock signal.

15. A delay locked loop of claim 13, wherein the start signal is applied to the variable delay circuit and the phase sensing pump, respectively.

* * * * *